Jan. 30, 1973 R. WÖLFLE ET AL 3,713,913

METHOD OF PRODUCING DIFFUSED SEMICONDUCTOR COMPONENTS FROM SILICON

Filed Dec. 12, 1969

United States Patent Office 3,713,913

Patented Jan. 30, 1973

3,713,913

METHOD OF PRODUCING DIFFUSED SEMICONDUCTOR COMPONENTS FROM SILICON

Rudolf Wolfle, Gilching, Dieter Rucker, Hohenschaftlarn, and Uta Lauerer, Neugermering, Germany, assignors to Siemens Aktiengesellschaft, Berlin and Munich, Germany Filed Dec. 12, 1969, Ser. No. 884,617
Claims priority, application Germany, Dec. 20, 1968, P 18 16 084.4
Int. Cl. H01l 7/34
U.S. Cl. 148—187 5 Claims

ABSTRACT OF THE DISCLOSURE

A method of producing a semiconductor component from silicon as the original material and at least two regions of variable conductance type produced by diffusion. The entire surface of a silicon wafer of a specific conductance type constituting the original body is coated with a doping substance in order to produce a region of opposite conductance type. Thereafter the dopant on the surface of the crystal wafer is removed by a mesa etching, with the exception of the component regions to be redoped. The regions on the surface of the crystal wafer that have been exposed by etching are provided by chemical means with a layer of nickel and dopant of the same conductance type as the original material. The regions defining the semiconductor device component are produced by indiffusing both the dopant of opposite conductance type and the dopant applied from the nickel layer into the semiconductor component.

Figure 1:
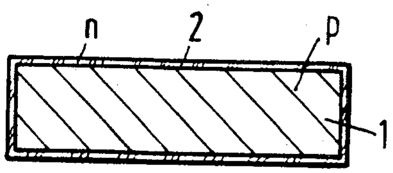

The present invention relates to a method for producing a diffused semiconductor component from silicon and which comprises at least two regions of variable conductance type.

It is customary to coat the surface with a $SiO_2$ layer, thereby masking it to prevent, during the diffusion process, redoping a weakly, for example p-doped region at the surface of a semiconductor crystal wafer, by impurity atoms which diffuse out of an adjacent, for example highly n-doped region.

Another possible mode of preventing the redoping is to dope the weakly coated layer on the surface to a higher degree so that it cannot become redoped. To effect such surface doping, which also facilitates a barrier free contact of the respective regions, we use coatings of the appropriate dopant, for example from the gaseous phase. Another method known as the "paint-on process," disclosed in German Pat. 1,046,785, suggests more strongly doping the weakly doped region on the surface. According to this process, the semiconductor surface is provided with a known glass forming compound which contains the dopant component and which is applied upon said semiconductor surface as a paste, dried and then diffused into said surface.

Due to the individual, partly very intricate method steps, such as the application of a masking layer, the use of the photo-etching method as well as the additional coating from the gaseous phase, the known methods are too expensive or, as in the case of the paint-on method, result in device components whose regions are doped very inhomogeneously and thus lead to a large variation of electrical parameters.

Our method provides a way making it possible to produce very simply and rationally, diffused semiconductor components with an exactly adjusted dopant concentration for the individual regions.

According to our invention, we provide the surface of the original body, which may constitute a semiconductor crystal wafer of silicon with a specific conductance type, with a dopant applied on both sides, over the entire area, for the purpose of producing a region of opposite conductance type.

The dopant applied on the surface of the crystal wafer up to the component regions to be redoped, is then removed by mesa etching. Thereafter the regions of the surface of the crystal wafer exposed by etching, are subjected to a chemically effected precipitation of a layer of nickel and a doping substance that defines the conductance type of the original body. Finally, the diffusion process, during which the semiconductor crystal is indiffused with the dopant of opposite conductance type and with the dopant applied by precipitated nickel, produces the regions that form the semiconductor device component.

It is within the framework of the present invention to indiffuse the applied dopant into the semiconductor body, prior to the mesa etching, down to a depth which is less than the subsequent mesa removal. It is also within the framework of the invention to oxidize the surface prior to the mesa etching or to coat-on an oxide. Among other things, this has the advantage that, during the subsequent nickel precipitation, the nickel will precipitate only upon oxide-free areas and will, thus, be limited to locations where it is to be effective. The coating required for mesa etching should not be removed prior to the nickel precipitation. This ensures that the nickel layer which contains the dopant is to be precipitated only at the localities where it is to take effect.

Boron and phosphorus are used as dopants in the nickel layer. It is particularly advantageous that the content of boron or phosphorus in the nickel layer be from 3 to 10%. The dopant containing nickel layer is to be precipitated at a layer thickness of about 0.1$\mu$.

If the coating such as, for example, the photo varnish which is necessary for mesa etching is left on the mesa or if the mesa surface is left oxidized, a suitable nickel plating will not result in a nickel coating at the protected region but occur only in the etched region where the weakly doped original crystal emerges to the surface. On the other hand, where the mesa surface is also nickel plated, said nickel plating must be so thin or the doping of the nickel plating must be so weak that no redoping or stronger compensation will occur in the region of the mesa, during subsequent diffusion.

A novel feature of the invention is that the boron or phosphorus containing nickel layer is precipitated in a very simple and inexpensive wet-chemical manner on a specific, desired region on the surface of a semiconductor crystal. Thus, during the subsequent diffusion process, the surface of the, for example, weakly doped p-region is more strongly doped through the content of boron in the nickel, or the weakly doped n-region becomes highly n-doped through the content of phosphorus, so that redoping by means of impurity atoms diffusing out of an adjacent highly doped region, becomes impossible.

Another advantage of the method of the invention is that a coating with nickel takes place simultaneously with the protective doping so that during the subsequent diffusion, the lifespan of the minority carriers remains much higher than it would without nickel. Moreover, the application of a barrier free contact to the localities provided with the nickel layer, is facilitated by the coating which is present at said localities.

The invention will be further described by an embodiment example, with reference to FIGS. 1 to 4 which disclose steps in the production of a diffused silicon transistor, with mesa structure.

In FIG. 1, the surface of a weakly p-doped (1 to 100 ohm-cm.) silicon crystal wafer 1 is coated with phosphorus. An oxidation of the entire device produces a layer 2 comprising phosphorus glass on the surface of the semiconductor body 1 and an underlying silicon layer of about 3 micron thickness, highly doped with phosphorus.

Figure 2:
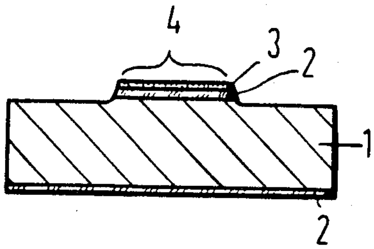

In FIG. 2, the surface of the semiconductor body 1 is freed from the phtosphorus glass and from the underlying phosphorus doped silicon 2, with the exception of region 4, which later defines the emitter. As FIG. 2 shows, this is effected by mesa etching with a conventional mixture of hydrofluoric acid and nitric acid, using a photo varnish mask 3.

Figure 3:
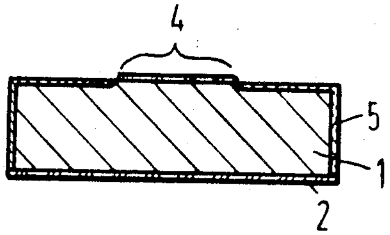

FIG. 3 shows the same arrangement as FIG. 2, upon which a nickel layer, provided with about 5% boron, is precipitated by chemical means, in a layer thickness of approximately $0.1\mu$. The device (1, 2) partly provided (in region 4) with the layer 2 is treated with an ammoniacal nickel sulfate solution which contains additions of sodium borate, sodium-boron hydrate and diamine hydrogen citrate. The nickel layer 5, produced on the silicon surface, is characterized by a very good adhesiveness and by a homogeneity of the layer thickness.

Following the precipitation of the selectively applied nickel layer provided with the boron dopant, upon the semiconductor crystal surface, the entire arrangement is subjected to a diffusion process at from 1000 to 1200° C. and the regions required for the functioning of the transistor are produced within the semiconductor crystal.

Figure 4:
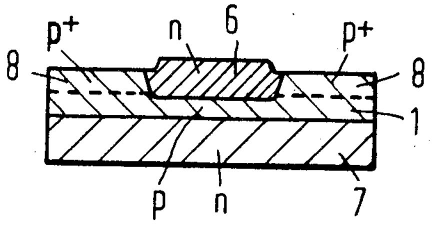

FIG. 4 shows the transistor device, following the diffusion process and prior to the application of the contacts. Numeral 1 denotes the p-doped base region, 6 and 7 indicate the indiffused emitter and collector region respectively and 8 the higher doped $p^+$ region produced as a diffusion source from the nickel layer which is provided with a boron doping, whereby said $p^+$ region then facilitates the barrier free contacting for the base region. Following the application of the metal contacts, the crystal wafer on which a plurality of the same devices are accommodated, is divided into the individual systems which are then ready for mounting.

We claim:

1. A method of producing a semiconductor component from silicon as the original material and having at least two regions of variable conductance type by diffusion, which comprises coating the entire surface of a silicon wafer of a specific conductance type with a doping substance in order to produce a region of opposite conductance type, removing, by mesa etching, the applied dopant of opposite conductance type, from the surface of the crystal wafer, with the exception of the component regions to be doped, by said dopant of opposite conductance type, depositing a $0.1\mu$ thick layer of nickel and containing 3 to 10% of a dopant of the same conductance type as the original material on regions of the surface of the crystal wafer that have been exposed by etching, and, finally, indiffusing the dopant of opposite conductance type and the dopant applied from the nickel layer, into the semiconductor component, thereby defining the semiconductor component.

2. The method of claim 1, wherein the doping substance applied is diffused, prior to mesa etching, into the semiconductor body down to a depth less than the subsequent mesa removal.

3. The method of claim 1, wherein an oxide layer is produced on the surface prior to mesa etching.

4. The method of claim 1, wherein the coating required for the mesa etching is not removed prior to the nickel precipitation.

5. The method of claim 1, wherein boron or phosphorus are used as dopants in the nickel layer.

References Cited

UNITED STATES PATENTS

| | | | |
|---|---|---|---|
| 2,975,080 | 3/1961 | Armstrong | 148—188 |
| 3,485,684 | 12/1969 | Mann et al. | 148—188 X |
| 2,974,073 | 3/1961 | Armstrong | 148—188 |
| 3,437,533 | 4/1969 | Dingwall | 148—188 X |
| 3,172,785 | 3/1965 | Jochems et al. | 148—1.5 |
| 3,601,888 | 8/1971 | Engeler et al. | 148—188 X |

HYLAND BIZOT, Primary Examiner

J. M. DAVIS, Assistant Examiner

U.S. Cl. X.R.

148—1.5, 188